(12) United States Patent
Wolgemuth et al.

(10) Patent No.: US 11,585,836 B2
(45) Date of Patent: Feb. 21, 2023

(54) CURRENT SENSING IN A WIRELESS POWER TRANSFER SYSTEM

(71) Applicant: Momentum Dynamics Corporation, Malvern, PA (US)

(72) Inventors: John M. Wolgemuth, Chester Springs, PA (US); Benjamin H. Cohen, Malvern, PA (US); Daniel S. Hackman, Ephrata, PA (US)

(73) Assignee: InductEV, Inc., Malvern, PA (US)

( * ) Notice: Subject to any disclaimer, the term of this patent is extended or adjusted under 35 U.S.C. 154(b) by 249 days.

(21) Appl. No.: 16/825,624

(22) Filed: Mar. 20, 2020

(65) Prior Publication Data
US 2021/0293855 A1    Sep. 23, 2021

(51) Int. Cl.
*G01R 15/18*    (2006.01)
*H02J 50/12*    (2016.01)
*G01R 1/00*    (2006.01)

(52) U.S. Cl.
CPC .............. *G01R 15/18* (2013.01); *H02J 50/12* (2016.02)

(58) Field of Classification Search
CPC .... H01F 1/00; H02H 1/00; G01R 1/00; G01R 5/00; G01R 3/00
See application file for complete search history.

(56) References Cited

U.S. PATENT DOCUMENTS

| | | | | |
|---|---|---|---|---|
| 4,182,982 A * | 1/1980 | Wolf | ................... | G01R 15/146 323/357 |
| 4,553,084 A | 11/1985 | Wrathall | | |
| 5,990,640 A * | 11/1999 | Dwyer | ...................... | H02P 7/04 318/400.29 |
| 6,072,708 A | 6/2000 | Fischer | | |
| 6,307,345 B1 * | 10/2001 | Lewis | ....................... | H02P 8/14 318/696 |
| 6,522,517 B1 * | 2/2003 | Edel | ..................... | G01R 15/185 361/143 |
| 6,670,792 B1 * | 12/2003 | Renehan | .............. | H02J 7/2434 322/17 |

(Continued)

FOREIGN PATENT DOCUMENTS

WO    2018222669 A1    12/2018

OTHER PUBLICATIONS

International Application No. PCT/US21/23259, International Search Report dated Jul. 29, 2021.

*Primary Examiner* — Jermele M Hollington
*Assistant Examiner* — Temilade S Rhodes-Vivour
(74) *Attorney, Agent, or Firm* — Culhane Meadows, PLLC

(57) ABSTRACT

A current sensing method measures a fractional current through a coil having a plurality of coil windings by using a current sensing resistor to measure a current through a subset of the plurality of coil windings and using a voltage sensor to measure a voltage drop across the current sensing resistor. The measured current and voltage values are provided to a processor to determine the fractional current and phase of the coil. For example, the fractional current and phase of the coil may be determined by calculating a total current of the coil as I=n(V/Rx), where n is the number of coil windings of the coil, V is the measured voltage, and Rx is the impedance of the current sensing resistor. The coil may be a secondary winding used in a wireless power transfer system.

14 Claims, 3 Drawing Sheets

(56) References Cited

U.S. PATENT DOCUMENTS

| | | | |
|---|---|---|---|
| 6,954,060 B1* | 10/2005 | Edel | G01R 15/183 |
| | | | 324/117 R |
| 10,416,196 B2 | 9/2019 | Urankar | |
| 10,802,049 B2 | 10/2020 | Park et al. | |
| 2003/0155813 A1* | 8/2003 | Walter | H02M 5/458 |
| | | | 307/31 |
| 2007/0021937 A1 | 1/2007 | Labuschagne et al. | |
| 2009/0026845 A1 | 1/2009 | Shin | |
| 2010/0090539 A1* | 4/2010 | Auchterlonie | H05H 1/46 |
| | | | 307/106 |
| 2013/0282312 A1 | 10/2013 | Abeywickrama et al. | |
| 2014/0339916 A1 | 11/2014 | Fells et al. | |
| 2015/0194836 A1 | 7/2015 | Teo et al. | |
| 2020/0150154 A1* | 5/2020 | Chang | G01R 35/005 |

\* cited by examiner

CURRENT SENSING IN A WIRELESS POWER TRANSFER SYSTEM

TECHNICAL FIELD

This disclosure relates to current measurement and, more particularly, to current measurement in a wireless power transfer system.

BACKGROUND

Resonant induction wireless charging makes use of an air core transformer consisting of two concentric coils displaced along a common coil axis. Electrical power is sent from the sending apparatus (i.e. the primary coil) to the receiving apparatus (i.e. the secondary coil) by means of magnetic flux linkage between the two transfer coils. An alternating current flowing in the primary coil induces an alternating current into the secondary coil.

One option for constructing coils is use of Litzendraht (aka Litz) wire or other conductive filaments. Litz wire consists of individually insulated wires twisted or braided into a uniform pattern with the primary benefit of reducing AC losses in high frequency windings. Alternately, as described in PCT Patent Application US2018035060, "WIRELESS POWER TRANSFER THIN PROFILE COIL ASSEMBLY," the coil conductors can be comprised of multiple conductive traces layered into an insulative, dielectric substrate (e.g. a printed circuit board).

An electric current is defined as an electric charge (e.g. electrons) in motion. Current is dq/dt, or the time rate of change of charge. The measure of flow of the current of electricity is expressed in amperes. The unit ampere (A) is defined as equal to a flow of one coulomb of charge per second. Measurement of current in an electrical circuit may be accomplished directly (e.g. using a sense resistor) or indirectly (e.g. using a Hall-effect sensor or an inductive sensor).

It is desired to provide a current measurement device for the high currents that may exist in wireless power transfer systems without adversely affecting the operation of the wireless power transfer system.

SUMMARY

Various details for the embodiments of the inventive subject matter are provided in the accompanying drawings and in the detailed description text below.

In sample embodiments, a current sensing device is provided for measuring current through a coil having a plurality of coil windings (e.g., Litz wire, printed circuit board traces, or conductive filaments). The coil windings are impedance matched and tightly coupled via mutual inductance with each other. The current sensing device includes a current sensing resistor connected to a subset of the plurality of coil windings to measure current through the subset of the plurality of coil windings, a voltage sensor that measures a voltage drop across the current sensing resistor, and a processor that determines a fractional current and phase of the coil from the measured current and voltage. In sample embodiments, the coil is a secondary winding used in a wireless power transfer system (inductive system or capacitively coupled system) including a rectifier that converts an alternating current on the secondary winding into a direct current for application to a load. An analog to digital converter may also be provided to digitize the voltage measured by the voltage sensor and to provide the measured voltage to the processor.

In sample applications, the processor determines a total current I through the secondary winding as $I=nV/\sqrt{2R+2\pi *L*f}$, where n is a number of coil windings of the secondary winding, V is the measured voltage, R is a resistance of the current sensing resistor, L is an inductance of the secondary winding, and f is a frequency of the alternating current on the secondary winding. Alternatively, the processor may determine a total current I through the secondary winding as $I=\{\Sigma[(Vn/Rn/n)]\}*m$, where Vn is the measured voltage for each secondary winding, Rn is a resistance for each current sensing resistor of each secondary winding, n is a number of coil windings sampled, and m is a total number of coil windings of the coil. The processor determines the fractional current and phase of the coil by calculating a total current of the coil as $I=n(V/Rz)$, where n is a number of coil windings of the coil, V is the measured voltage, and Rz is an impedance of the current sensing resistor.

In sample embodiments, the sensing resistor has a value $R>>X$, where $X=2\pi*L*f$, where L is a parasitic inductance of the current sensing resistor, and f is a frequency of the alternating current on the secondary winding.

A method of measuring current through a coil comprising a plurality of coil windings is also provided. The method includes using a current sensing resistor to measure a current through a subset of the plurality of coil windings, measuring a voltage drop across the current sensing resistor, and determining a fractional current and phase of the coil from the measured current and voltage. The method may be implemented in embodiments where the coil is a secondary winding used in a wireless power transfer system comprising a rectifier that converts an alternating current on the secondary winding into a direct current for application to a load. The method further includes digitizing the measured voltage and providing the measured voltage to a rectifier controller that determines the fractional current and phase of the coil and controls the operation of the rectifier.

In sample embodiments of the method, the method includes calculating a total current I through the secondary winding as $I=nV/\sqrt{2R+2\pi*L*f}$, where n is the number of coil windings of the secondary winding, V is the measured voltage, R is a resistance of the current sensing resistor, L is an inductance of the secondary winding, and f is a frequency of the alternating current on the secondary winding. The method may further include calculating a total current I through the secondary winding as $I=\{\Sigma[(Vn/Rn/n)]\}*m$, where Vn is a measured voltage for each sampled secondary winding, Rn is a resistance for each current sensing resistor of each sampled secondary winding, n is a number of coil windings sampled, and m is a total number of coil windings of the coil. The method may also include calculating a total current of the coil as $I=n(V/Rz)$, where n is the number of coil windings of the coil, V is the measured voltage, and Rz is an impedance of the current sensing resistor.

The method may further include selecting the current sensing resistor to (a) limit inductance to prevent out-of-phase subtraction when measured current returns to the plurality of coil windings and/or (b) reduce impact of inductance while keeping heating and power loss to a minimum. In sample embodiments, the current sensing resistor is selected to have a value $R>>X$, where $X=2\pi*L*f$, where L is a parasitic inductance of the current sensing resistor, and f is a frequency of the alternating current on the secondary winding.

This summary section is provided to introduce aspects of the inventive subject matter in a simplified form, with further explanation of the inventive subject matter following in the text of the detailed description. This summary section is not intended to identify essential or required features of the claimed subject matter, and the particular combination and order of elements listed this summary section is not intended to provide limitation to the elements of the claimed subject matter. Rather, it will be understood that the following section provides summarized examples of some of the embodiments described in the Detailed Description below.

BRIEF DESCRIPTION OF THE DRAWINGS

The foregoing and other beneficial features and advantages of the invention will become apparent from the following detailed description in connection with the attached figures, of which.

DETAILED DESCRIPTION OF ILLUSTRATIVE EMBODIMENTS

Figure 1:
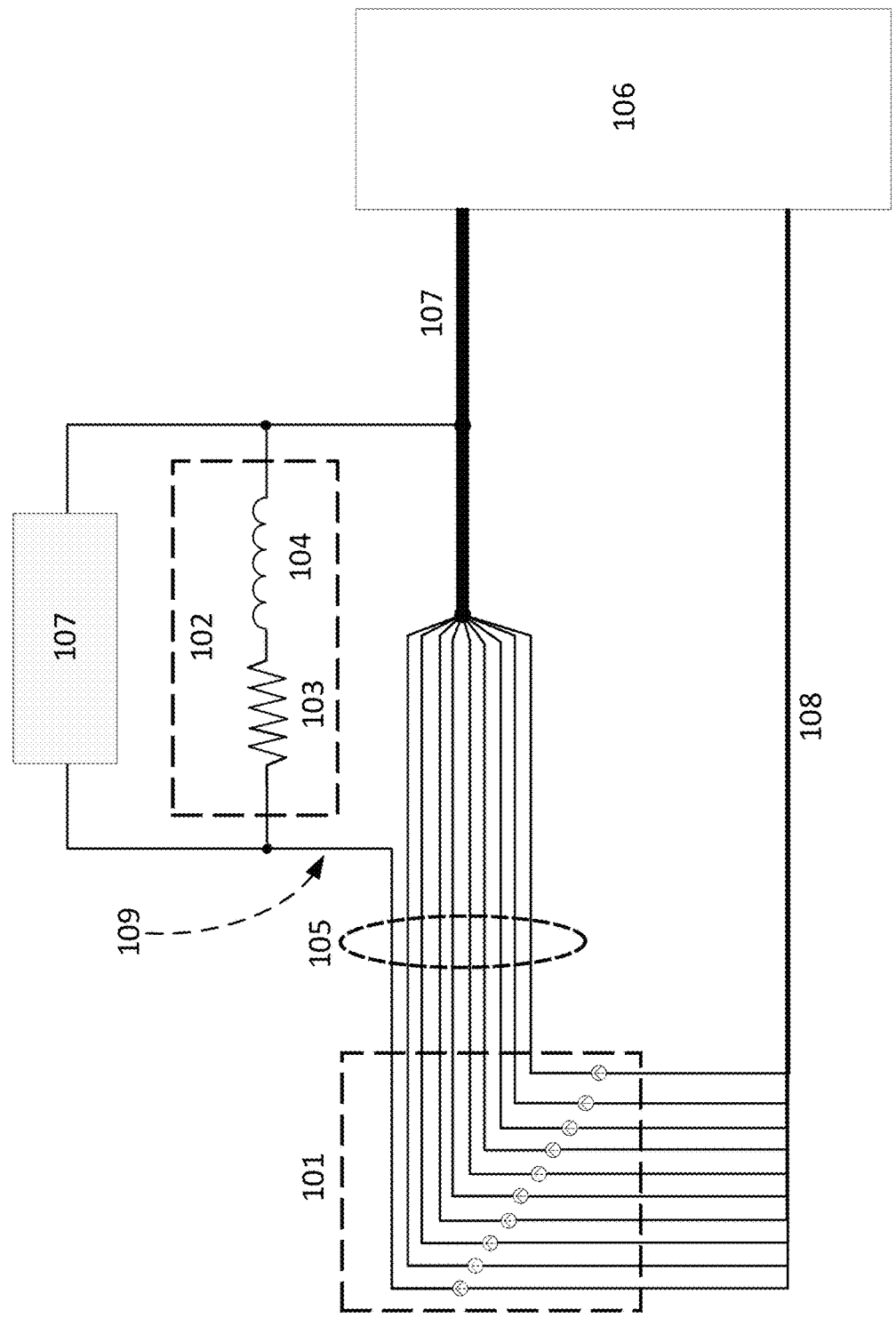
FIG. 1 schematically illustrates current measurement in a wireless power transmission system in a sample embodiment.

The current sensing for wireless power transmission and associated method described herein may be understood more readily by reference to the following detailed description taken in connection with the accompanying figures and examples, which form a part of this disclosure. It is to be understood that this description is not limited to the specific products, methods, conditions or parameters described and/or shown herein, and that the terminology used herein is for the purpose of describing particular embodiments by way of example only and is not intended to be limiting of any claimed subject matter. Similarly, any description as to a possible mechanism or mode of action or reason for improvement is meant to be illustrative only, and the subject matter described herein is not to be constrained by the correctness or incorrectness of any such suggested mechanism or mode of action or reason for improvement. Throughout this text, it is recognized that the descriptions refer both to methods and systems/software for implementing such methods.

A detailed description of illustrative embodiments will now be described with reference to FIGS. 1-3. Although this description provides a detailed example of possible implementations, it should be noted that these details are intended to be exemplary and in no way delimit the scope of the inventive subject matter.

Indirect current sensing is typically used in circuits with load currents in the 100A-1000A range. Indirect current sensing allows galvanic isolation from the conductor under measurement. When using a Hall effect-based sensor, the sensor is installed between the anode and load. The Hall effect sensor uses the Lorentz force (the force exerted on an electron moving through a magnetic field) which creates a voltage difference (the Hall voltage) across an electrical conductor, transverse to the current in the conductor and to an applied magnetic field perpendicular to the current to determine alternating current (AC) and direct current (DC) flow. The inductive current sensor or current sense transformer uses Faraday's law of induction with the conducting wire acting as primary and the voltage output as secondary to measure alternating current (AC) in the conducting wire based on the magnetic flux produced.

Since at high power with a high impedance load, the wireless power transfer (WPT) system will always be a current source (i.e., an AC Voltage Controlled Current Source) and since high power WPT systems will generate stray magnetic flux, use of the indirect measurement techniques and technologies are problematic especially as part of the closed control loop of an active rectifier.

A direct method of current measurement is through use of a sense resistor. The sense resistor, nominally a resistor with a small Ohmic value, is placed in-line with a circuit network, typically close to the circuit ground or battery cathode. The total current through the sense resistor is then measured by measuring the voltage drop across the resistor and computing current as $i(t)=v(t)/R$ where $i(t)$ is the current, in amperes, as a function of time, $v(t)$ is the voltage across the sense resistor, in volts, as a function of time, and R is the resistance of the sense resistor, in Ohms. The sense resistor is selected to have a minimal resistance to avoid excessive heating and perturbation of the power delivery to the load (because power loss in the sense resistor is proportional to the resistance).

For alternating current systems, such as for use in a magnetic resonance-based WPT system, the sense resistor selected should have a minimal reactance component of the total impedance for the same reasons. The requirement for a precise AC signal measurement (e.g. current, frequency, phase), at the frequency of concern, drives the requirement for a reactance that must be small relative to the resistance.

The use of a current sense resistor in a high current system (e.g., 125 Amps RMS and higher) to measure the full AC current is prohibitive due to power dissipation heating. Another issue is the physics of construction of a resistor physically large enough to handle that current without creating a large unavoidable inductance. The additional parasitic inductance may then add too much phase angle to the AC signal for an accurate measurement.

However, a fractional current sensing method can be constructed for a WPT system that exploits the multi-conductor construction of the secondary's coil windings to separate a subset of the conductors which are then connected through a resistor with a low Ohm rating. The conductor current passes through the very small value resistor (with the inherent parasitic inductance) and the voltage drop is measured across the resistor to determine the fractional current and phase.

A current sensing resistor is low cost and remains reliable even in the presence of stray magnetic flux generated by the WPT system. However, because the current sense resistor is a resistive element (albeit one with some self-inductance), the heat it generates is proportional to the square of current passing therethrough, limiting its usefulness in a high current power supply like that used in a WPT system. However, by exploiting the multi-element construction of a magnetic coil, a sense resistor placed on a single conductor can produce a measurement of the fractional current without generating excessive heat, while also not impinging on the power delivery capabilities of the system as a whole. This fractional current measurement provides accurate phase measurement with multiplication and accurate current measurement for the control system (e.g., the active rectification system and power control feedback).

In practice, any resistor includes an inevitable parasitic inductance. This inductance leads to a phase shift in the output. Since the measured conductor is returned to the bundle of tightly coupled parallel conductors, and through mutual inductance shares the total current load, the power reduction may be far more than that of the just resistive heating loss.

Since resistor construction varies, a low inductance model can be selected. Since the impact of the resistor on delivered power (and dissipative heating) is reduced by the fraction of conductors sensed over the total number of conductors, in the fractional current measurement system, a larger Ohm (relatively) resistor can be selected to reduce the relative impact of the self-inductance component. The larger resistor value also creates a greater dynamic voltage range for more precise voltage and thus fractional current level and current phase sensing.

In sample embodiments, the sensing resistor is selected to limit inductance or to use a high but still relatively low value to reduce impact of the inductor while keeping heating and power loss to a minimum. A higher resistance provides a higher dynamic range for voltage leading to more accurate current sensing. The inductance is also limited to prevent out-of-phase subtraction when measured current returns to the tightly coupled bundle of conductors.

FIG. 1

In FIG. 1, multiple conductors (e.g., Litz wire, printed circuit board traces, or conductive filaments) are used in the secondary coil of a WPT system (e.g. an inductive system, a magnetic resonant coupled inductive system, or even a capacitively coupled system). The secondary 101 appears in the circuit as a bank of independent current supplies each with its own conductor 105. Each conductor 105 is impedance matched and tightly coupled, via mutual inductance, with the other conductors 105. FIG. 1 uses ten conductors 105 for purposes of illustration only. The load 106 is supplied with power from the secondary 101 via a power bus 107 that combines the individual conductors 105 into a single conductor or power bus. The circuit is completed by the return electrical bus 108 from the load 106 to the secondary 101.

Current measurement is achieved by selection of a subset of the independent conductors 105 (in this example a single conductor 109) which connect via a current sense resistor 102. The current sense resistor 102 has both a resistive impedance component (the reactance) 103 as well as an inductive impedance component 104. The voltage sensor 107 reads the voltage drop across the current sense resistor 102.

The voltage sensor readings 107 and the impedance of the resistor 102 are used to derive current. Since the impedance matched, tightly coupled conductors 105 share current produced by the secondary 101, the total current delivered to the load 106 can be calculated. For example, when a single conductor 109 is measured, the total current is n(V/Rz) where n is the number of conductors (e.g. n=1 for single conductor), V is the measured voltage across the sense resistor 102, and Rz is the impedance of the sense resistor 102.

FIG. 2

Figure 2:
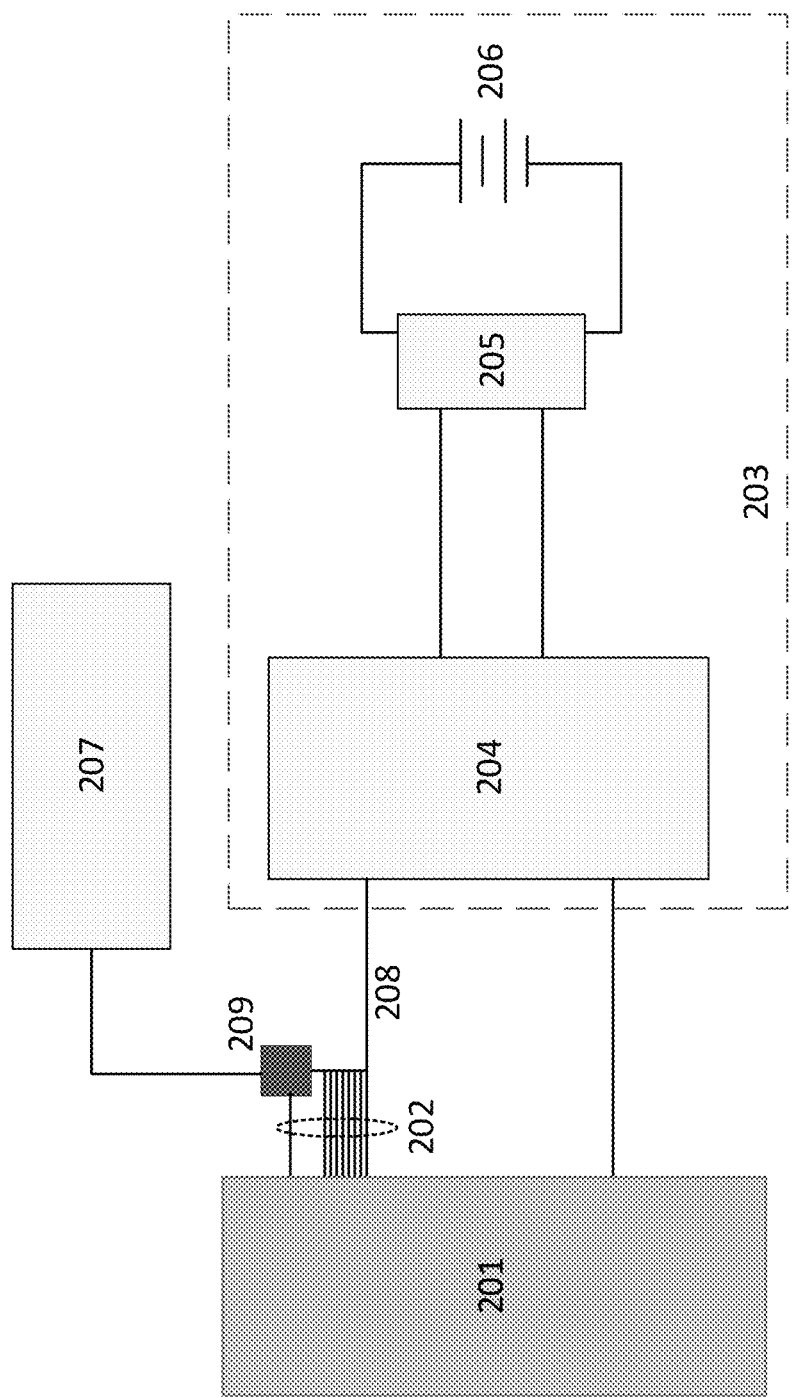
FIG. 2 functionally illustrates a wireless power transfer system that uses current measurements in a sample embodiment.

In FIG. 2, a high-level schematic for a direct current battery charging circuit using magnetic induction with current measurement in a sample embodiment is shown. The receiver 201 or secondary consists of a secondary coil with multiple windings 202. The receiver 201 can be inductive, resonant inductive or capacitive. The receiver 201 converts the magnetic field from the transmitter (not shown) into an alternating electrical current. The alternating current 208 developed by the resonant network 201 is used to power the load 203. The first stage of the load is a passive (diode-based) or active (switch-based) rectifier 204 that can be used to convert the alternating current to the direct current needed to charge the battery 206 (a battery may be wet, dry, solid state, capacitive or hybrid (e.g. a battery with capacitive component)). For charging a battery 206, the rectified DC signal may be smoothed and level-converted by the conditioner circuitry 205.

The current sensor 209 is used to monitor the alternating current 208 developed by the receiver 201. The current level, frequency, and phase is reported to the controller 207. The controller 207 may report electrical signal characteristics to ancillary systems such as displays, closed loop control systems, safety systems, and active rectification control switching.

FIG. 3

Figure 3:
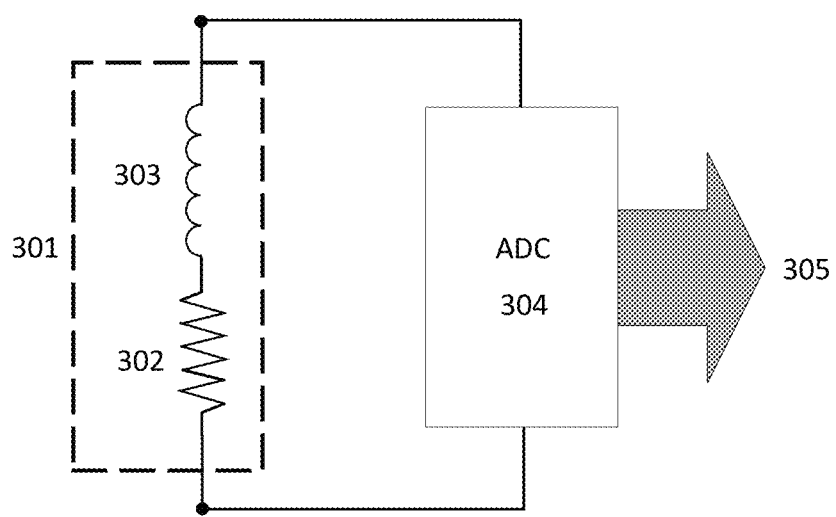
FIG. 3 illustrates current measurement hardware in a sample embodiment.

FIG. 3 shows an example embodiment of a current sensor using a current sense resistor 301. The current sense resistor 301 has both resistive (ohmic) 302 and inductive 303 impedance components. In this example, an Analog-to-Digital Converter (ADC) 304, is used to digitize the voltage produced across the current sense resistor 301. The ADC 304 connects to other systems, such as an active rectification controller 207, using a digital interface 305. The active rectification controller 207 may include a processor that calculates the current from the measured values as described herein.

As an example, for a WPT system with a 60 conductive element receiver with a single conductor measured, the current through the measured conductor would be $i=V/\sqrt{(R^2+(2\pi*L*f)^2)}$, where i is the single conductor current in Amps, V is the measured voltage in Volts, R is the resistor value in Ohms, and L is a parasitic inductance value of the current sense resistor in Henrys, and f is the frequency of the AC signal in Hertz.

Alternative Embodiment—Multiple Parallel Current Sensing

Once the single conductor current (i) is calculated, the current is multiplied by the number of tightly coupled conductors to determine a system current level. In other words, the current would be $i=nV/\sqrt{(R^2+2\pi*L*f)}$, where n is the number of conductors. In cases where multiple conductors are measured, the sum of individual measured currents are averaged. This average per conductor current is then multiplied by the number of tightly coupled conductors to determine the total system current level.

In the simplest case, a single conductor is separated from the tightly inductively coil windings for fractional current sensing. In some cases, multiple conductors can be sensed, each with its own current sense resistor. In the case of multiple conductors, the sensed current is averaged and then multiplied:

$$i(total)=\{\Sigma[(Vn/Rn)/n]\}*m$$

where i(total) is the system current, Vn is the sampled voltage in conductors 1 to n, and Rn is the current resistors impedance for each resistor, where n is the number of conductors sampled and m is the total number of conductors.

Alternative Embodiment—Unknown Parasitic Induction

For high power (i.e., high current) systems, using a single current sense resistor to sense the entire alternating current is not desirable because of the power dissipation (via heating) in that resistor. This heating can be mitigated by using an arbitrarily small value resistor. However, when the resistance value becomes too small, the impedance of the sense resistor starts to be dominated by reactance, i.e. the parasitic inductance of the sense resistor. This reactance dominance leads to unwanted phase shifts and also affects the magnitude of the measurement of the alternating current as follows:

$$v(t)=i(t)*[\mathrm{sqrt}(R^2+(2^2*L*f)^2)]$$

where v(t) is the voltage, i(t) is the current, R is the ohmic value of the sense resistor, L is the parasitic inductance inherent in the sense resistor, and f is the frequency of the AC signal.

Since voltage, v(t), is the quantity that is measured by the measurement system (see, e.g., FIG. 3), it can be seen by inspection that if the quantity under the radical increases, then the sensed voltage, v(t) will increase. So, in the case of a sense resistor where R<<X, (where X=2π*L*f), the sensed voltage, from which the current is computed, will be dominated by the inductance. If the exact inductance is unknown, then it is nearly impossible to compute an accurate current. However, the system and method of fractional current sensing of tightly coupled parallel conductors circumvents this problem by allowing R to be >>X.

For example, if n=60 conductors, when sensing 1/60 of the total current (a single conductor of the total), the resistance of the sense resistor can be 60× greater than the case of using a single sense resistor to sense to total current. More generally, R≥nX, where n is the number of coil windings of the coil. This, of course, assumes that the power dissipation of the sense resistor is held constant.

The advantage of the fractional sensing concept is that with R>>X, not only is the phase angle very close to zero, but the amplitude of the voltage signal is dominated by the real component of the impedance, that is, the ohmic resistance. So practically speaking, knowing the exact parasitic inductance of the sense resistor is not necessary for computing an accurate voltage measurement (and thus current level, phase and frequency) as long as the resistance component is much larger than the reactance created by the inductive component.

CONCLUSION

While various implementations have been described above, it should be understood that they have been presented by way of example only, and not limitation. For example, any of the elements associated with the systems and methods described above may employ any of the desired functionality set forth hereinabove. Thus, the breadth and scope of a preferred implementation should not be limited by any of the above-described sample implementations.

As discussed herein, the logic, commands, or instructions that implement aspects of the methods described herein may be provided in a computing system including any number of form factors for the computing system such as desktop or notebook personal computers, mobile devices such as tablets, netbooks, and smartphones, client terminals and server-hosted machine instances, and the like. Another embodiment discussed herein includes the incorporation of the techniques discussed herein into other forms, including into other forms of programmed logic, hardware configurations, or specialized components or modules, including an apparatus with respective means to perform the functions of such techniques. The respective algorithms used to implement the functions of such techniques may include a sequence of some or all of the electronic operations described herein, or other aspects depicted in the accompanying drawings and detailed description below. Such systems and computer-readable media including instructions for implementing the methods described herein also constitute sample embodiments.

The monitoring and control functions of the controller 207 described herein may be implemented in software in one embodiment. The software may consist of computer executable instructions stored on computer readable media or computer readable storage device such as one or more non-transitory memories or other type of hardware-based storage devices, either local or networked. Further, such functions correspond to modules, which may be software, hardware, firmware, or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server, or other computer system, turning such computer system into a specifically programmed machine.

Examples, as described herein, may include, or may operate on, processors, logic, or a number of components, modules, or mechanisms (herein "modules"). Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. The software, when executed by the underlying hardware of the module, causes the hardware to perform the specified operations.

Accordingly, the term "module" is understood to encompass a tangible hardware and/or software entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Those skilled in the art will appreciate that the topology and circuit implementation methodology described herein enables effective realization as a single application specific integrated circuit. Further, while the disclosure contained herein pertains to the provision of electrical power to vehicles, it should be understood that this is only one of many possible applications, and other embodiments including non-vehicular applications are possible. For example, those skilled in the art will appreciate that there are numerous applications of providing a current source safety circuit in non-vehicle inductive charging applications such as portable consumer electronic device chargers, such as those (e.g., PowerMat™) used to charge toothbrushes, cellular telephones, and other devices. Accordingly, these and other such applications are included within the scope of the following claims.

What is claimed:

1. A method of measuring current through a coil comprising a plurality of coil windings, comprising:
   connecting a current sensing resistor to a subset of the plurality of coil windings to directly measure a current through the subset of the plurality of coil windings;
   measuring a voltage drop across the current sensing resistor; and
   determining a fractional current and phase of the coil from the measured current and voltage.

2. The method of claim 1, wherein the coil is a secondary winding used in a wireless power transfer system comprising a rectifier that converts an alternating current on the secondary winding into a direct current for application to a load.

3. The method of claim 2, further comprising digitizing the measured voltage and providing the measured voltage to a rectifier controller that determines the fractional current and phase of the coil and controls the operation of the rectifier.

4. The method of claim 3, further comprising calculating a total current I through the secondary winding as $I=\{\Sigma[(V_n/R_n/n)]\}*m$, where $V_n$ is a measured voltage for each sampled secondary winding, $R_n$ is a resistance for each current sensing resistor of each sampled secondary winding, n is a number of coil windings sampled, and m is a total number of coil windings of the coil.

5. The method of claim 3, further comprising calculating a total current of the coil as $I=n(V/R_z)$, where n is the number of coil windings of the coil, V is the measured voltage, and $R_z$ is an impedance of the current sensing resistor.

6. The method of claim 1, further comprising selecting the current sensing resistor to at least one of (a) limit inductance to prevent out-of-phase subtraction when measured current returns to the plurality of coil windings and (b) reduce impact of inductance while keeping heating and power loss to a minimum.

7. A current sensing device for measuring current through a coil comprising a plurality of coil windings, comprising:
   a current sensing resistor connected to a subset of the plurality of coil windings to directly measure current through the subset of the plurality of coil windings;
   a voltage sensor that measures a voltage drop across the current sensing resistor; and
   a processor that determines a fractional current and phase of the coil from the measured current and voltage.

8. The device of claim 7, wherein the coil is a secondary winding used in a wireless power transfer system comprising a rectifier that converts an alternating current on the secondary winding into a direct current for application to a load.

9. The device of claim 8, further comprising an analog to digital converter that digitizes the voltage measured by the voltage sensor and provides the measured voltage to the processor.

10. The device of claim 9, wherein the processor determines a total current I through the secondary winding as $I=\{\Sigma[(V_n/R_n/n)]\}*m*$, where $V_n$ is the measured voltage for each secondary winding, $R_n$ is a resistance for each current sensing resistor of each secondary winding, n is a number of coil windings sampled, and n is a total number of coil windings of the coil.

11. The device of claim 9, wherein the processor determines the fractional current and phase of the coil by calculating a total current of the coil as $I=n(V/R_z)$, where n is a number of coil windings of the coil, V is the measured voltage, and $R_z$ is an impedance of the current sensing resistor.

12. The device of claim 7, wherein the coil windings comprise one of Litz wire, printed circuit board traces, and conductive filaments.

13. The device of claim 7, wherein the coil windings are impedance matched and tightly coupled via mutual inductance with each other.

14. The device of claim 8, wherein the wireless power transfer system comprises one of an inductive system and a capacitively coupled system.

* * * * *